United States Patent [19]

Ohsako

[11] Patent Number: 5,250,319
[45] Date of Patent: Oct. 5, 1993

[54] PROCESS FOR PREPARATION OF ELECTROCONDUCTIVE POLYMERIC MATERIAL PROVIDED WITHIN GROOVES

[75] Inventor: Nagisa Ohsako, Yokohama, Japan

[73] Assignee: Fujitsu Limited, Kawasaki, Japan

[21] Appl. No.: 865,752

[22] Filed: Apr. 10, 1992

Related U.S. Application Data

[63] Continuation of Ser. No. 643,958, Jan. 22, 1991, abandoned.

[30] Foreign Application Priority Data

Jan. 24, 1990 [JP] Japan .................................. 2-012642
Jun. 25, 1990 [JP] Japan .................................. 2-166043

[51] Int. Cl.⁵ ............................................. B05D 5/12
[52] U.S. Cl. ................................. 427/96; 427/255.6;
427/286; 427/302; 427/309; 156/48
[58] Field of Search ............ 427/255.6, 309, 292, 427/286, 419.8, 209, 96, 301, 302; 156/48

[56] References Cited

U.S. PATENT DOCUMENTS

| | | | |
|---|---|---|---|
| 4,271,209 | 6/1981 | De Palma et al. | 427/96 |
| 4,451,633 | 5/1984 | Brownscombe et al. | 264/328.1 |
| 4,631,205 | 12/1986 | Eveleigh | 427/255.6 |
| 4,675,137 | 6/1987 | Umetsu | 427/301 |
| 4,927,578 | 5/1990 | Naarmann et al. | 427/255.6 |
| 5,080,993 | 1/1992 | Maruta et al. | 427/292 |
| 5,130,296 | 7/1992 | Takano et al. | 427/309 |
| 5,169,680 | 12/1992 | Ting et al. | 427/96 |
| 5,175,023 | 12/1992 | Iwase | 427/96 |
| 5,196,395 | 3/1993 | James | 427/309 |

OTHER PUBLICATIONS

Clarke et al, *Apparatus for Growing Oriented Polymer Films*, IBM Tech. Disclosure Bulletin, vol. 21, No. 12, May 1979.

*Primary Examiner*—Shrive Beck
*Assistant Examiner*—Diana Lynn Dudash
*Attorney, Agent, or Firm*—Armstrong, Westerman, Hattori, McLeland & Naughton

[57] ABSTRACT

Disclosed is a process for the preparation of an electroconductive polymeric material, comprising the steps of forming fine grooves in a substrate, embedding a polymerization reaction catalyst in the fine grooves, and bringing a monomer capable of forming an electroconductive polymeric material into contact with the catalyst embedded in the fine grooves to selectively form fine wiring of the electroconductive polymeric material in the grooves. According to this process, a polymeric material oriented in the longitudinal direction of the fine grooves can be prepared, and therefore, a polymeric material having an excellent electroconductivity can be provided.

10 Claims, 6 Drawing Sheets

Fig. 3A
Fig. 3B
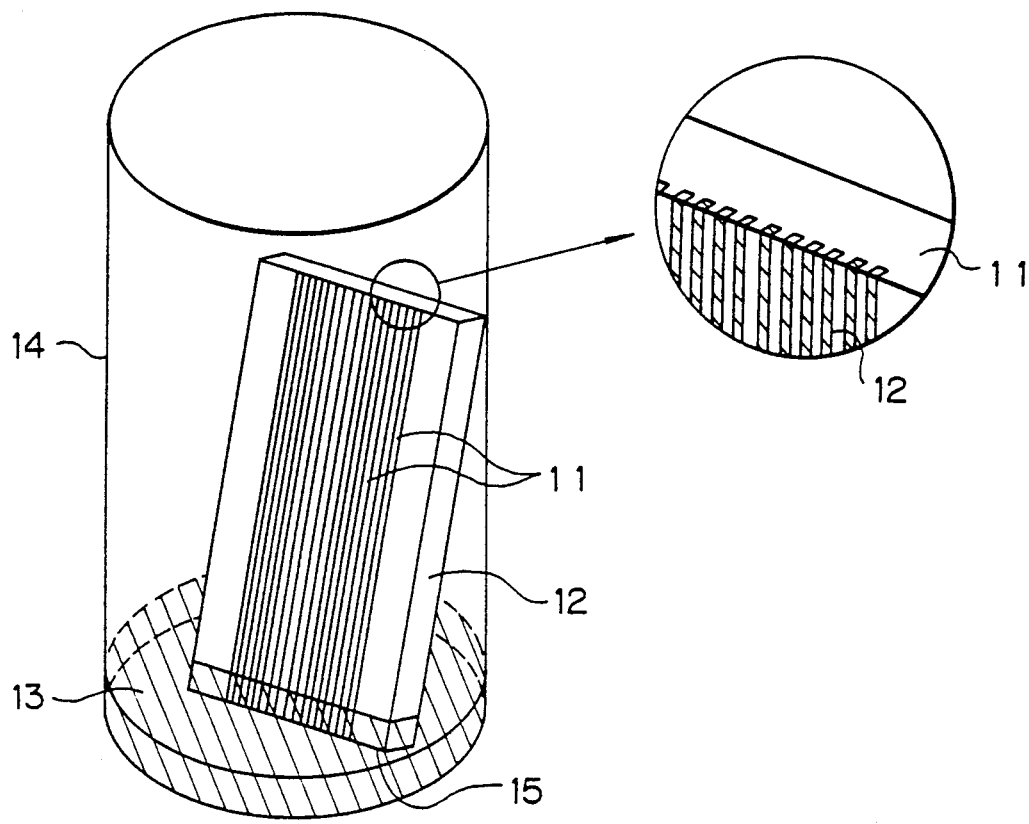
Fig. 4A
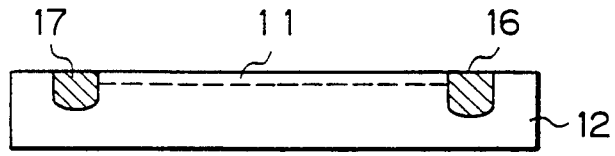
Fig. 4B
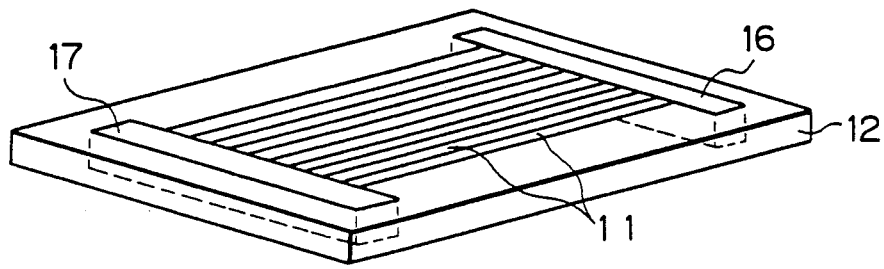

5,250,319

PROCESS FOR PREPARATION OF ELECTROCONDUCTIVE POLYMERIC MATERIAL PROVIDED WITHIN GROOVES

This application is a continuation of application Ser. No. 07/643,958 filed Jan. 22, 1991, now abandoned.

BACKGROUND OF THE INVENTION (1) Field of the Invention

The present invention relates to a process for the preparation of an electroconductive polymeric material oriented in a certain direction.

(2) Description of the Related Art

As the semiconductive material, there can be mentioned element semiconductors such as silicon (Si) and germanium (Ge) and compound semiconductors such as gallium arsenide (GaAs) and indium phosphide (InP), and devices such as transistors and IC are fabricated by using these semiconductor materials. Each of these semiconductor materials is an inorganic material.

Polyacetylene $(CH)_n$ is an aliphatic unsaturated hydrocarbon having conjugated double bonds in the molecule, and polyacetylene can be rendered electroconductive by adding an impurity such as iodine (I) at a low concentration, and it is known that the electric conduction mechanism of this electroconductive polymeric material is different from that of the conventional inorganic semiconductor (A. J. Epstein, Physical Review Letters, Vol. 50, No. 23, page 1866, 1983).

Since this electroconductive polymeric material can be easily formed into a thin film, the material has attracted attention as a semiconductor device-forming material and investigations have been made into a practical utilization thereof.

A thin film of polyacetylene can be prepared by using a Ziegler-Natta catalyst comprising triethyl aluminum (abbreviated to AlEt) and tetrabutoxy titanium [abbreviated to $Ti(OBu)_4$] and introducing acetylene ($HC{\equiv}HC$) gas to a substrate to which the catalyst is applied in the form of a film.

When the so-formed polyacetylene film is observed by a microscope, it is seen that molecule chains and hairy fine fibers (fibrils) grow while randomly crossing one another, to form a film. Polyacetylene has an anisotropy in the direction of electric conduction and is characterized in that the electric resistance is low in the longitudinal direction of the fibril. Nevertheless an unoriented film in which fibrils grow while randomly crossing one another does not show a high conductivity.

For example, a process has been proposed in which polyacetylene is synthesized in the form of a film and the film is patterned by the lithographic technique to form an element comprising an insulating zone and an electroconductive zone (see, for example, Japanese Unexamined Patent Publication No. 58-107646). According to this process, however, areas in which the patterning direction is not in agreement with the orientation direction of fibrils are readily formed, and often fibrils are cut at unexpected parts in the boundary between the electroconductive zone and insulating zone.

Therefore, as the means for obtaining a good orientation, a process has been proposed in which polyacetylene is drawn in one direction or a magnetic field is applied at the time of synthesis [see, for example, Synthetic Metals, 28 (1989), D51–D56]. Nevertheless, the process in which polyacetylene is drawn is not suitable for the fabrication of devices, and the process for obtaining an orientation by application of a magnetic field is unsatisfactory in that a large apparatus must be used and it is difficult to apply this process to a large substrate.

SUMMARY OF THE INVENTION

As mentioned above, the electroconductive polymeric film is valuable as a semiconductor material, but for a practical utilization of this film, the fibrils must be oriented in the same direction to produce a high conductivity.

Therefore, a primary object of the present invention is to provide a process in which fibrils are oriented in a certain direction, by a relatively easy means.

In accordance with the present invention, there is provided a process for the preparation of an electroconductive polymeric material, which comprises forming fine grooves on a substrate, embedding a polymerization reaction catalyst in the fine grooves, and bringing a monomer capable of forming an electroconductive polymeric material into contact with the catalyst embedded in the fine grooves to selectively form a fine wiring of the electroconductive polymeric material in the grooves.

In accordance with one preferred embodiment of the present invention, linear fine grooves are formed on the substrate, a catalyst solution is fed into the fine grooves by the capillary phenomenon, and flow of a monomer gas is fed over the substrate to effect polymerization, whereby a polymer having a high conductivity in the longitudinal direction of the fine grooves is formed in the fine grooves.

BRIEF DESCRIPTION OF THE DRAWINGS

FIG. 3A is a perspective view showing another principle of the present invention, and FIG. 3B is an enlarged partial view showing this principle;

FIG. 4A is a sectional view illustrating still another principle of the present invention, and FIG. 4B is a perspective view showing this principle;

DESCRIPTION OF THE PREFERRED EMBODIMENTS

The present invention relates to a process for imparting an orientation to an electroconductive polymer such as polyacetylene by utilizing a shape anisotropy.

In polyacetylene having a slender shape, fibrils are arranged in the longitudinal direction, and therefore, the polyacetylene shows a shape anisotropy and the electroconductivity in the longitudinal direction is greater than the electroconductivity in the transverse (width) direction.

Since the presence of a catalyst (Ziegler-Natta catalyst) is indispensable for a polymerization of acetylene to polyacetylene, in accordance with one embodiment of the present invention, fine grooves are formed in a substrate and the catalyst is embedded in the fine grooves, and acetylene is supplied onto the substrate and polymerized to polyacetylene. For example, if the width of the fine grooves is less than 1 μm and many fine grooves are formed at pitches of several μm, an electroconductive polymer having substantially a slender strip-like shape can be obtained.

Figure 1:
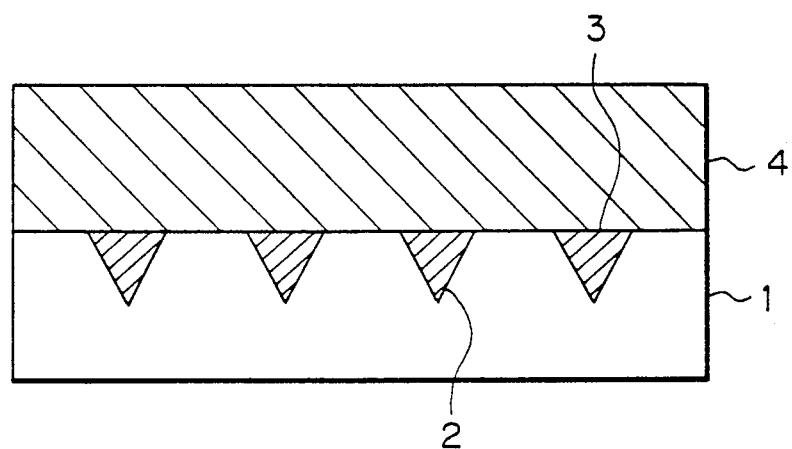
FIG. 1 is a diagram illustrating the principle of the present invention.

Referring to FIG. 1 illustrating the principle of the present invention, reference numeral 1 represents a solid substrate which may be composed of an inorganic solid substance and supports one-dimensional fine wiring of an electroconductive polymer to be formed, and fine grooves 2 are formed in the substrate 1; the sectional shape of the fine grooves is not particularly critical. A solution 3 of a polymerization catalyst is embedded in the fine grooves 2, and a monomer gas 4 is converted to a polymer by the catalyst solution 3.

According to the present invention, as shown in FIG. 1, if the monomer gas 4 is brought into contact with the catalyst solution 3 embedded in the fine grooves 2 below the surface of the substrate 1, and the monomer gas 4 is polymerized only at the portion where the catalyst solution 3 is present, whereby a fine line of an electroconductive polymer is formed. Accordingly, if the fine grooves are arranged in a predetermined direction, wiring of electroconductive polymer fine lines is formed in which fibrils are oriented in the longitudinal direction in the grooves.

As the monomer to be used in this process, there can be mentioned not only acetylene but also heterocyclic compounds such as thiophene, pyrrole, furan and selenophene. As the catalyst to be used, there can be mentioned not only a triethyl aluminum/tetrabutoxy titanium mixture but also Lewis acids such as $FeCl_3$, $CoCl_5$ $RuCl_3$. As the solvent for the catalyst, there can be mentioned, for example, toluene and anhydrous chloroform.

Figure 2A:
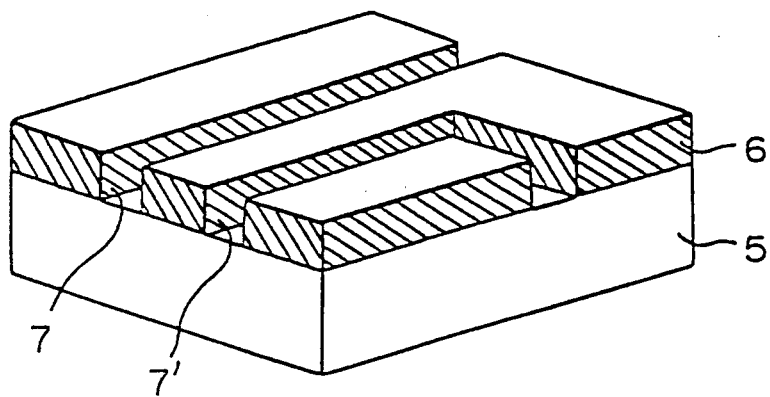
FIGS. 2a, 2b, 2c, 2d, and 2e are diagrams illustrating one embodiment of the present invention.
Figure 2A:
Figure 2B:
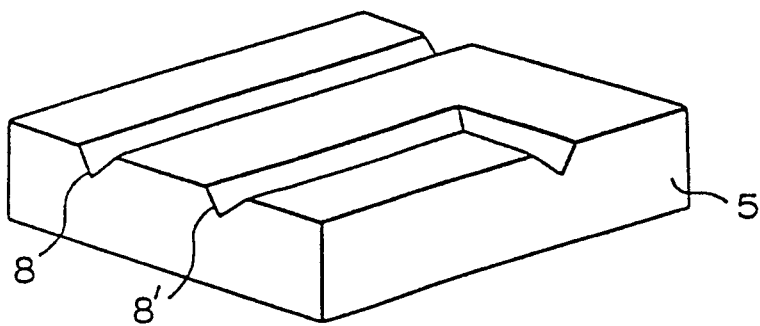
Figure 2B:
Figure 2C:
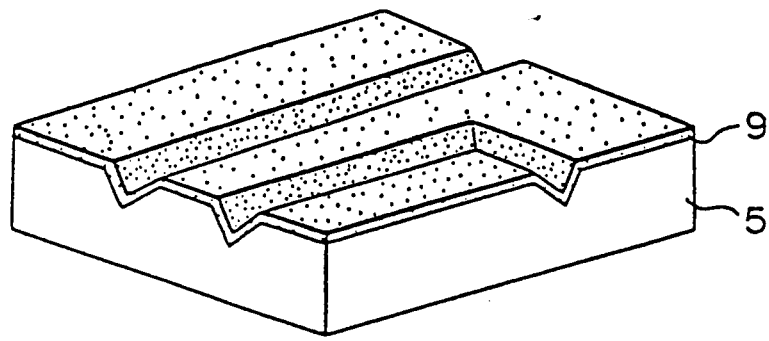
Figure 2D:
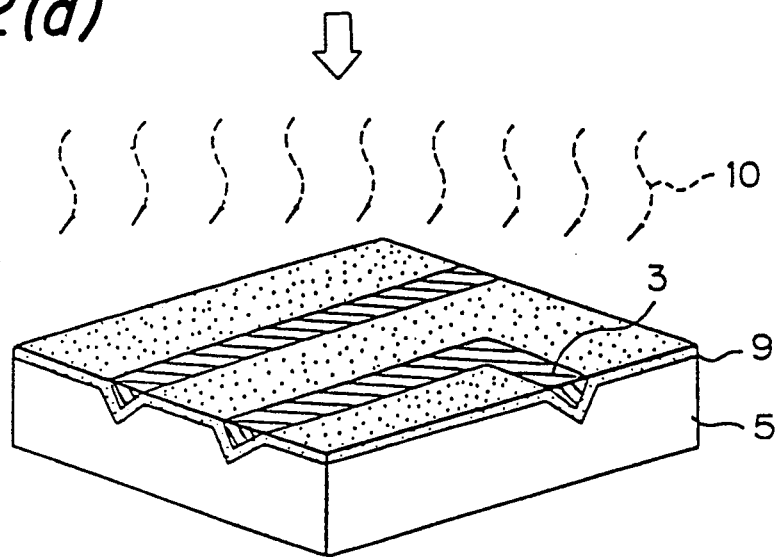
Figure 2E:
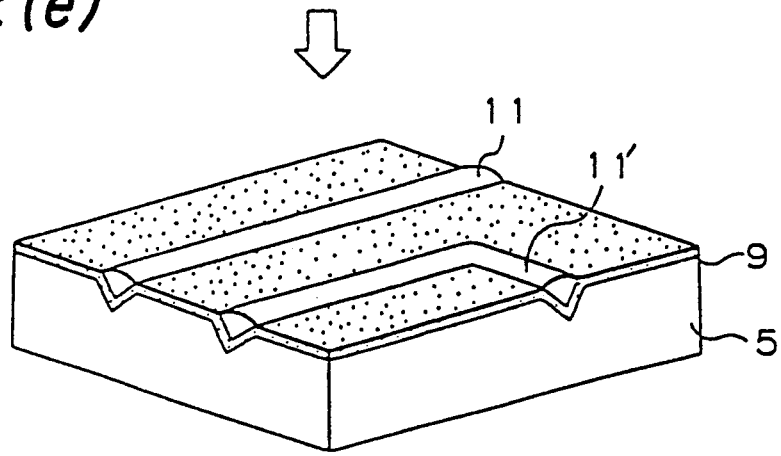

FIGS. 2a through 2e are diagrams illustrating the process steps of forming wiring according to one embodiment of the present invention. FIG. 2a shows a state where a patterned SiN film 6 is formed on an Si substrate 5 by conventional lithographic and etching techniques. The top surface of the Si substrate 5 is the (100) plane, and openings 7 and 7' of the pattern on the SiN film 6 are formed along the directions [011] and [01$\bar{1}$]. The thickness of the SiN film 6 is 1000 Å, and the width of the openings 7 and 7' is 0.8 μm. In this state, the Si substrate 5 is subjected to anisotropic etching with a solution of KOH, to form grooves 8 and 8', as shown in FIG. 2b. Then, the SiN film 6 is removed and the Si substrate 5 is oxidized to form an oxidized layer 9 having a thickness of 1000 Å, as shown in FIG. 2c. A small amount of the catalyst solution 3 is dropped and spread on the surface of the processed Si substrate 5, and when the catalyst solution 3 intrudes into the grooves 8 and 8', the surface of the substrate 5 is wiped with a lint-free tissue impregnated with a solvent, whereby the catalyst solution 3 is embedded only in the grooves 8, 8', as shown in FIG. 2d. The substrate 5 is then exposed to a monomer gas (acetylene gas) 10 as shown in FIG. 2d, whereby polyacetylene 11, 11' is synthesized as the electroconductive polymer, as shown in FIG. 2e.

The conditions adopted for the synthesis of polyacetylene 11, 11' are as follows. The catalyst composition is a toluene solution of a mixture comprising triethyl aluminum and tetrabutoxy titanium at a ratio of 4/1, and the Ti concentration is 0.1 mol/l. The acetylene gas pressure is 150 Torr and the reaction time is 10 minutes. The synthesized polyacetylene is washed with a solvent, and a thermal isomerization is carried out under a vacuum of $10^{-5}$ Torr at 200° C. for 20 minutes. Then, the entire substrate is exposed to an iodine vapor (0.001 Torr) for 1 hour, to effect doping.

This reaction is generally carried out at a Ti concentration of 0.05 to 0.2 mol/l, an acetylene pressure of 100 to 750 Torr, and a reaction temperature of −80° to 0° C. for 5 to 20 minutes.

FIG. 3A and 3B and FIGS. 4A and 4B illustrate other principles of the present invention, in which the catalyst solution is permeated therein by utilizing the capillary phenomenon and an electroconductive polymer is formed only in the fine grooves. To facilitate an understanding of this phenomenon, materials and members of the same kind are represented by the same reference numbers.

FIG. 3A and 3B show an embodiment in which the catalyst solution is permeated in the longitudinal direction. More specifically, as shown in FIG. 3B, a substrate 12 having many fine grooves 11 formed therein is placed in a vessel 14 charged with a catalyst solution 13, the end face 15 of the substrate 12 is immersed in the catalyst solution 13, and the catalyst solution 13 is sucked up along the fine grooves 11 by the capillary phenomenon.

FIGS. 4A and 4B show an embodiment in which the catalyst solution is permeated in the transverse direction. More specifically, long liquid reservoirs 16 and 17 are formed on both sides of the surface of a substrate 12, and many fine grooves 11 are formed to connect the liquid reservoirs 16 and 17. The catalyst solution is charged in the liquid reservoirs 16 and 17 and the catalyst solution is permeated into the fine grooves 11 by the capillary phenomenon.

The substrate 12 is placed in a vessel filled with an inert gas, only the fine grooves 11 are wetted with the catalyst solution, the inert gas is discharged, and then a monomer gas (acetylene) is introduced into the vessel, whereby polyacetylene oriented in the longitudinal direction is formed only in the fine grooves 11.

FIGS. 5a through 5d are diagrams illustrating the process steps of forming oriented polyacetylene on a substrate according to the embodiment illustrated in FIGS. 3A and 3B.

A substrate 12 having a length of 8 mm, in which many fine grooves 11 having a width of 0.2 μm and a depth of 0.5 μm are formed, is put against the side wall of a reaction tube 18, using tweezers.

Figure 5A:
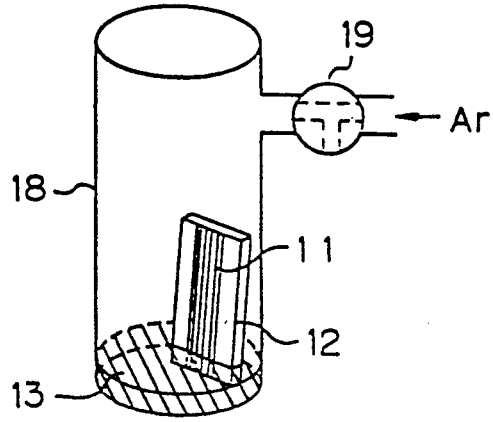
FIGS. 5a, 5b, 5c, 5d, are diagrams illustrating another embodiment of the present invention.

A cock 19 is opened to supply argon (Ar) gas, and excess gas is allowed to overflow from the reaction tube 18. Then, a Ziegler-Natta catalyst solution 3 comprising toluene as the solvent is added to a height of 1 mm from the bottom of the reaction tube 18. The composition of the Ziegler-Natta catalyst solution 13 is such that the AlEt$_3$/Ti(OBu)$_4$ ratio is 4/1 and the Ti concentration is 0.1 mole/l. The foregoing steps are shown in FIG. 5a.

Figure 5B:
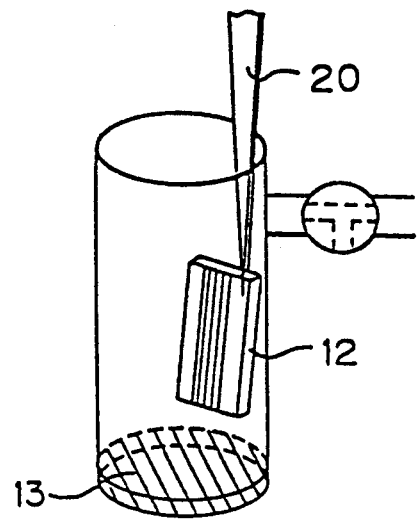

After the catalyst solution is raised to the end face of the substrate 12 by the capillary phenomenon in the above-mentioned state (after about 30 seconds), the substrate 12 is pulled up from the catalyst solution 13, using tweezers 20 (FIG. 5b).

Figure 5C:
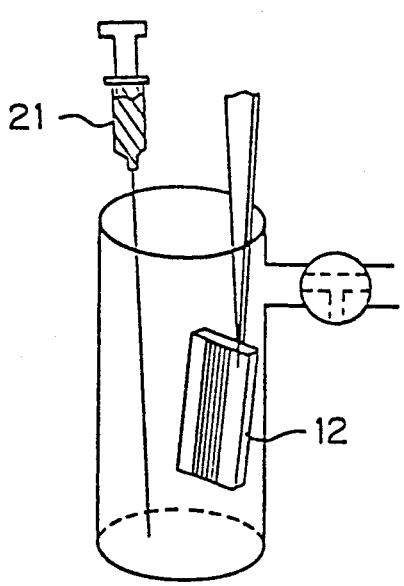

Then, the catalyst solution is sucked by a syringe 21 having a long needle, and the substrate 12 is returned to the original position (FIG. 5c).

Then, an adapter 24 provided with cocks 22 and 23 is fitted to the reaction tube 18, and the reaction tube 18 evacuated by operating the cocks and then cooled to −78° C. Thereafter, the cock is closed and the cock 22 is opened to introduce acetylene ($C_2H_2$) gas and a polymerization of the acetylene is carried out.

The reason why the temperature of the reaction tube 18 is maintained at −78° C. is that a formation of polyacetylene having the cis-structure is intended.

Figure 5D:
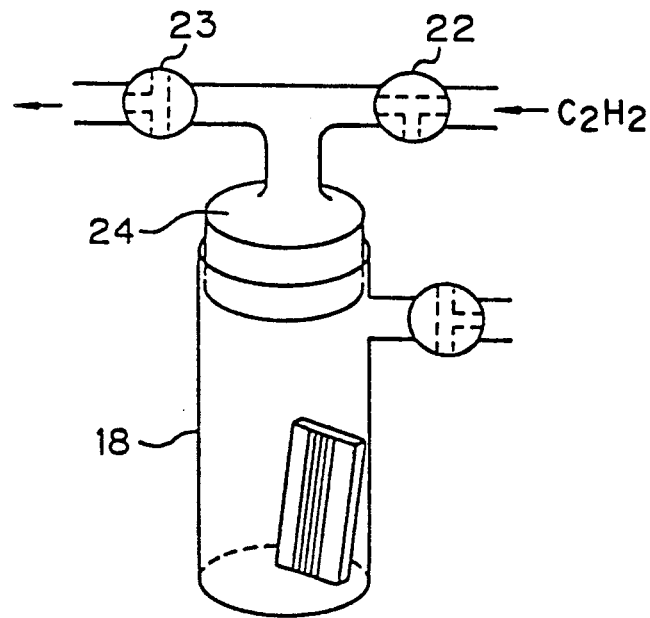

The foregoing steps are shown in FIG. 5d.

According to the above-mentioned process, polyethylene oriented in the direction of the fine grooves 11 can be obtained.

Figure 6A:
FIG. 6A is an electron microscope photo showing a section of a substrate having fine lines composed of polyacetylene in fine grooves, which is obtained according to the process of the present invention.
Figure 6B:
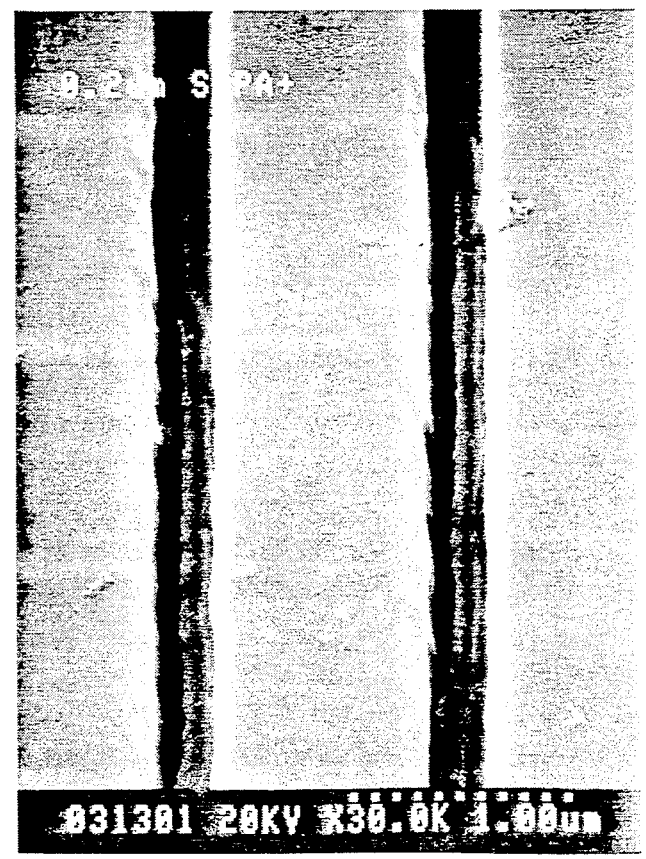
FIG. 6B is an electron microscope photo showing the plane of the substrate shown in FIG. 6A.

Electron microscope photos of the section and plane of a substrate having fine lines of polyacetylene formed in fine grooves in the above-mentioned manner are shown in FIGS. 6A and 6B, respectively.

Also in the process shown in FIGS. 4A and 4B, polyacetylene oriented in one direction can be obtained by adopting procedures similar to those mentioned above.

According to the present invention, since the catalyst is introduced only in fine grooves, a polymeric material oriented in the longitudinal direction of fine grooves by the shape anisotropy can be prepared. Therefore, according to the present invention, a polymeric material having an excellent electroconductivity can be provided.

I claim:

1. A process for the preparation of an electroconductive polymeric material, comprising the steps of forming grooves having a width of less than about 1 μm in a substrate, embedding a polymerization reaction catalyst in the grooves, and bringing a monomer capable of forming an electroconductive polymeric material into contact with the catalyst embedded in the grooves, to selectively form wiring of the electroconductive polymeric material in the grooves, the formed electroconductive polymeric material being oriented in the longitudinal direction of the grooves.

2. A process according to claim 1, wherein the monomer is acetylene.

3. A process according to claim 1, wherein the catalyst is a Ziegler-Natta catalyst.

4. A process according to claim 3, wherein the catalyst is a triethyl aluminum/tetrabutoxy titanium mixture.

5. A process for the preparation of an electroconductive polymeric material, comprising the steps of forming grooves having a width of less than about 1 μm on a substrate, introducing a catalyst solution into the grooves by the capillary phenomenon and introducing a monomer gas onto the substrate, whereby a polymer having an anisotropy in the longitudinal direction of the grooves is formed in the grooves.

6. A process according to claim 5, wherein a plurality of parallel grooves are formed between the end faces of the substrate, and one end face of the substrate is immersed in the catalyst solution and the catalyst solution is fed into the grooves by the capillary phenomenon.

7. A process according to claim 5, wherein long liquid reservoirs are formed parallel to each other on both sides of the substrate, a plurality of grooves are formed parallel to one another to connect the liquid reservoirs to each other, and the catalyst solution is fed into the grooves by the capillary phenomenon.

8. A process according to claim 5, wherein the monomer gas is acetylene.

9. A process according to claim 5, wherein the catalyst is a Ziegler-Natta catalyst.

10. A process according to claim 9, wherein the catalyst is a triethyl aluminum/tetrabutoxy titanium mixture.

* * * * *